United States Patent [19]
Hirata et al.

[11] Patent Number: 5,521,433
[45] Date of Patent: May 28, 1996

[54] IC CARD INCLUDING A SUBSTRATE HAVING IMPROVED STRENGTH AND HEAT RADIATION PROPERTIES

[75] Inventors: Teru Hirata; Shigeo Onoda; Tetsuro Washida; Yasuhiro Murasawa, all of Itami, Japan

[73] Assignee: Mitsubishi Denki Kabushiki Kaisha, Tokyo, Japan

[21] Appl. No.: 408,300

[22] Filed: Mar. 22, 1995

[30] Foreign Application Priority Data

Apr. 26, 1994 [JP] Japan .................................... 6-088608

[51] Int. Cl.⁶ .......................... H01L 23/02; H01L 23/053; H01L 23/12
[52] U.S. Cl. ............................. 257/679; 257/701
[58] Field of Search ................... 257/679, 697, 257/680, 681, 702, 701

[56] References Cited

U.S. PATENT DOCUMENTS

| 4,532,419 | 7/1985 | Takeda | 257/679 |
| 4,910,582 | 3/1990 | Miyamoto et al. | 257/679 |
| 4,962,415 | 10/1990 | Yamamoto | 257/679 |

*Primary Examiner*—Sara W. Crane
*Assistant Examiner*—S. V. Clark
*Attorney, Agent, or Firm*—Leydig, Voit & Mayer

[57] ABSTRACT

An IC card includes a substrate having a metal fiber resin material layer made of a mixture of a resin and metal fibers and a conductive pattern. The conductive pattern and the metal fiber resin material layer are electrically insulated from each other by a resist film. Heat radiation and mechanical strength of the IC card are enhanced.

9 Claims, 6 Drawing Sheets

IC CARD INCLUDING A SUBSTRATE HAVING IMPROVED STRENGTH AND HEAT RADIATION PROPERTIES

BACKGROUND OF THE INVENTION

1. Field of the Invention

The present invention relates to an IC card, and more particularly, to improvements in heat radiation and mechanical strength of the IC card.

2. Description of the Related Art

As developments have been recently made in fast and high-capacity cards, ICs to be mounted on the IC cards have also become faster and have increased power consumption so that the amount of heat generated by IC cards has increased. Furthermore, the IC cards are thin relative to their width and length. Since mechanical stress may be applied to IC cards, depending on how they are handled, insufficient rigidity resulting from that shape is a problem.

Such IC cards are disclosed in, for example, Japanese Patent Laid-Open Nos. 63-57296 and 2-255394 and Japanese Utility Model Laid-Open Nos. 62-202669, 3-61303 and 3-104721.

FIG. 19 is a sectional view showing an example of a conventional IC card. Referring to FIG. 19, a plurality of ICs, that is, IC packages 2 are mounted on a substrate 1 made of glass epoxy. The substrate 1 and the IC packages 2 constitute a module 3, which is fixed to a frame 4 made of resin. Conductive panels 5 and 6 are fixed to the frame 4 opposed to both sides of the substrate 1.

In such a conventional IC card, heat generated from the IC packages 2 is transmitted to the frame 4 and the conductive panels 5 and 6 through a space between the IC packages 2 and the conductive panels 5 and 6, and the substrate 1, and radiated therefrom into outside air. Therefore, heat radiation of the conventional IC card depends on the heat conductivity of these components. On the other hand, the mechanical strength of the whole IC card depends on the rigidity of the components.

In the conventional IC card having the above structure, since heat radiation and mechanical strength depend on characteristics of the components, it is difficult to maintain sufficient heat radiation and mechanical strength to speed up the response and increase the capacity of the IC packages 2.

SUMMARY OF THE INVENTION

The present invention aims to solve the above problem, and an object of the present invention is to provide an IC card having improved heat radiation and mechanical strength.

In order to achieve the above object, according to one aspect of the present invention, there is provided an IC card which comprises a substrate having a metal fiber resin material layer made of a metal fiber resin material containing a mixture of a resin material and a metal fiber material, and a conductive pattern electrically insulated from the metal fiber resin material layer, an IC mounted on the substrate, and a sheathing member for sheathing the outer periphery of the substrate.

According to another aspect of the present invention, there is provided an IC card which comprises a substrate with a conductive pattern thereon, an IC mounted on the substrate, a frame made of a metal fiber resin material containing a mixture of a resin material and a metal fiber material for holding the substrate, and panels attached to the frame to be respectively opposed to both sides of the substrate.

DESCRIPTION OF THE PREFERRED EMBODIMENT

Embodiment 1

Figure 1:
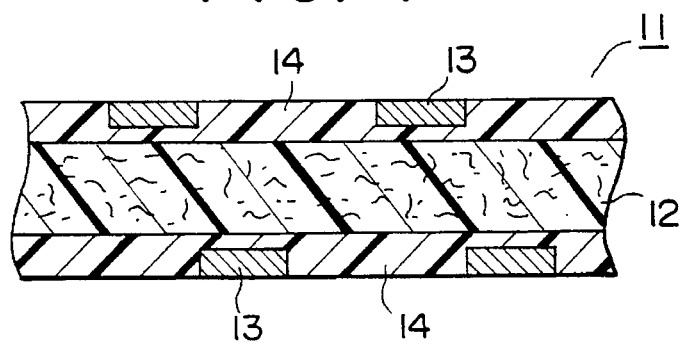
FIG. 1 is a sectional view showing a part of a substrate of an IC card according to a first embodiment of the present invention.

FIG. 1 is a sectional view showing a part of a substrate of an IC card according to a first embodiment of the present invention. Referring to FIG. 1, a substrate 11 comprises a metal fiber resin material layer 12, conductive patterns 13 on both sides of the metal fiber resin material layer 12 and made of, for example, copper or aluminum, and resist films 14 electrically insulating the metal fiber resin material layer 12 from the conductive patterns 13, and the conductive patterns 13.

In the metal fiber resin material layer 12, metal fibers are mixed in a resin, for example, a thermoplastic resin. As the metal fibers, fiber having a relatively high heat conductivity, such as copper, aluminum or gold, or a combination thereof, may be used.

In producing the substrate 11, the metal fiber resin material layer 12 is first molded, a resist is deposited onto the metal fiber resin material layer 12, and grounds of the resist films 14 are formed by exposure and development. After that, conductive metal is deposited, and the conductive patterns 13 and the resist films 14 are formed by repeating photoetching, that is, exposure and development.

Figure 2:
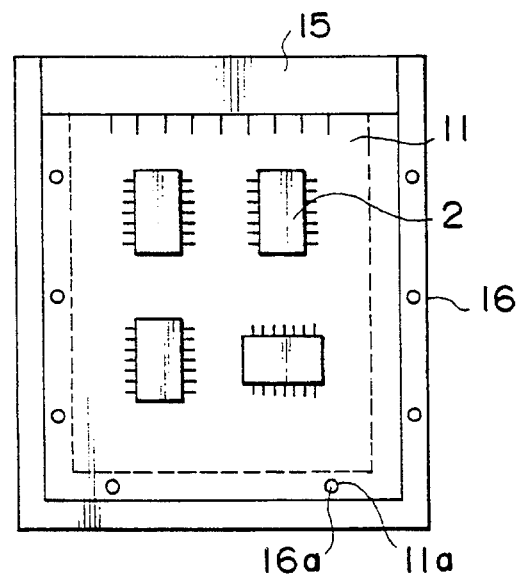
FIG. 2 is a plan view showing the substrate shown in FIG. 1 mounted to a frame.
Figure 3:
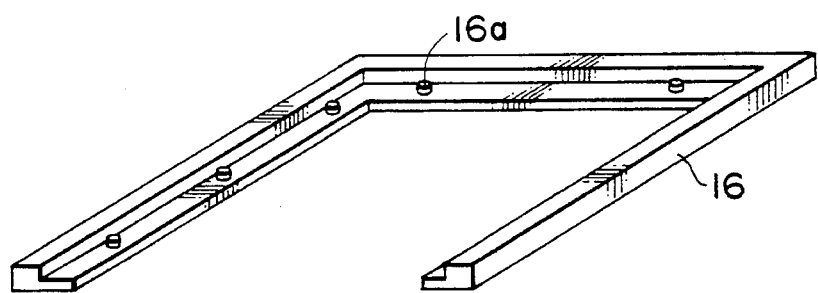
FIG. 3 is a perspective view of the frame shown in FIG. 2.

FIG. 2 is a plan view showing the substrate 11 shown in FIG. 1 mounted to a frame. Electronic components including IC packages 2 are mounted on the substrate 11 produced in the above-mentioned manner, a connector 15 for external connection is connected to one end of the substrate 11, and the substrate 11 is mounted to a frame 16. The frame 16 is made of a metal fiber resin material similar to that used in the metal fiber resin material layer 12 of the substrate 11. As shown in FIG. 3, the frame 16 is provided with a plurality of projections 16a, and the substrate 11 is provided with fitting holes 11a in which the projections 16a are received. The substrate 11 is attached to the frame 16 by fitting the projections 16a in the fitting holes 11a, and fixed by an adhesive or the like.

After the substrate 11 is mounted to the frame 16 as described above, panels (not shown) are bonded to the frame 16 opposed to the substrate 11. The panels and the frame 16 each have a fitting means (not shown), and are positioned by the fitting means. In this first embodiment, the frame 16 and the panels constitute a sheathing member.

Figure 19:
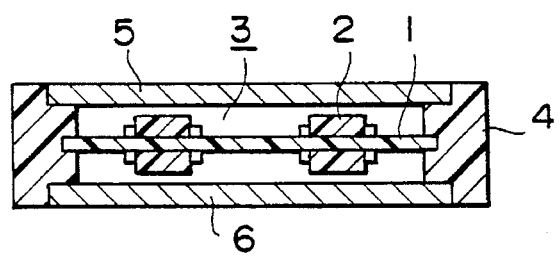
FIG. 19 is a sectional view showing an example of a conventional IC card.

Since the substrate 11 has the metal fiber resin material layer 12 in this embodiment, heat conductivity, heat radiation and mechanical strength of the IC card are higher than those of the substrate 11 made of glass epoxy shown in FIG. 19. Furthermore, since the metal fiber resin material layer 12 can be molded, its shape is more flexible than when a mere metal plate is used as a base of the substrate, and can be easily changed by using various kinds of molds. Still further, material cost can be reduced.

Embodiment 2

Figure 4:
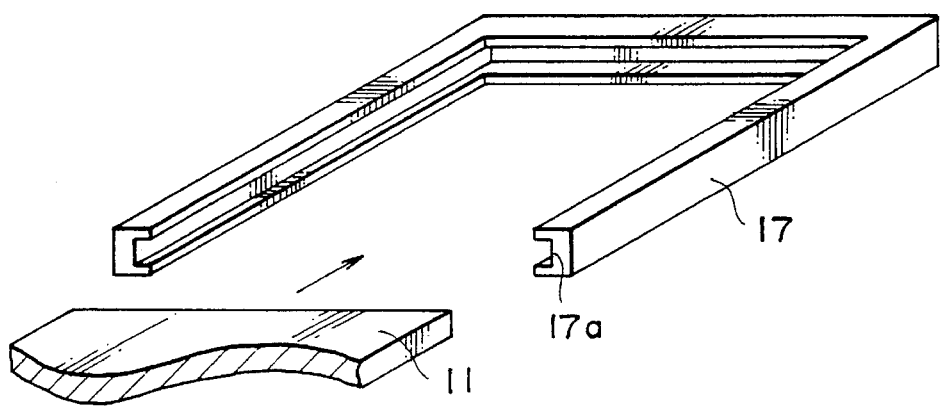
FIG. 4 is a perspective view showing another method of mounting a substrate to a frame.
Figure 5:
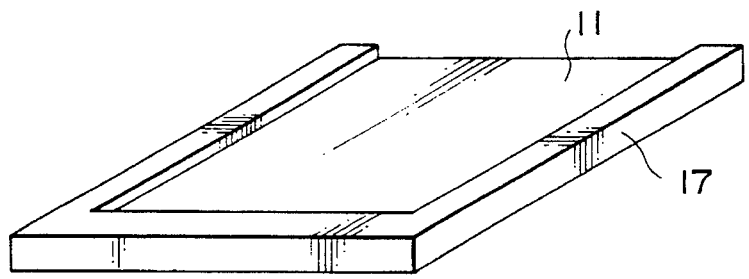
FIG. 5 is a perspective view showing the substrate shown in FIG. 4 mounted to the frame.

FIG. 4 is a perspective view showing another method of mounting a substrate to a frame, and FIG. 5 is a perspective view showing the substrate shown in FIG. 4 mounted to the frame. As shown in FIG. 4, a frame 17 has a substrate holding groove 17a on the inner periphery thereof. A substrate 11 is inserted along the substrate holding groove 17a, and held by the frame 17 as shown in FIG. 5. Such mounting method allows the substrate 11 to be positioned only by inserting the substrate 11 in the substrate holding groove 17a, and to be fixed in the direction of thickness thereof.

Although frames made of a metal fiber resin material are used in the above embodiments, the material of the frames is not limited to the metal fiber resin material. Materials different from the material of the substrate, for example, a metal such as aluminum, may be used.

Furthermore, the material of the substrate is not limited to the metal fiber resin material. A substrate made of an a metal, for example, aluminum or aluminum alloy, may be used. In this case, heat radiation and mechanical strength can be improved.

Although the connector is connected to the end of the substrate in the above embodiments, the present invention is also applicable to an IC card having no connector.

Embodiment 3

Figure 6:
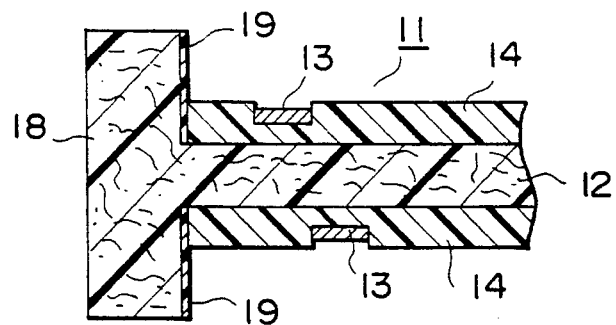
FIG. 6 is a sectional view of the principal part of an IC card according to a third embodiment of the present invention.

FIG. 6 is a sectional view showing the principal part of an IC card according to a third embodiment of the present invention. In the third embodiment, a frame 18 made of a metal fiber resin material is integrally formed with a metal fiber resin material layer 12 of a substrate 11 by one-piece molding. A masking member 19 is stuck to the side of the frame 18 next to the substrate 11. Conductive patterns and resist films 14 are formed in the same manner as in the above first embodiment.

Since the frame 18 and the substrate 11 are unitary in this IC card, the assembly process is simplified and production cost is reduced.

Embodiment 4

Figure 7:
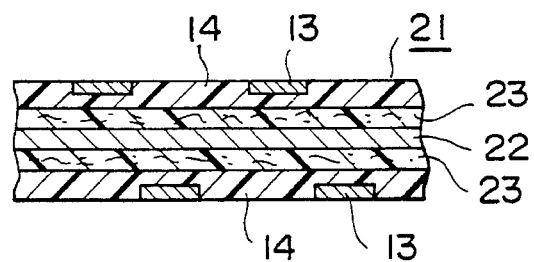
FIG. 7 is a sectional view showing a part of a substrate of an IC card according to a fourth embodiment of the present invention.

FIG. 7 is a sectional view showing a part of a substrate of an IC card according to a fourth embodiment of the present invention. Referring to FIG. 7, a substrate comprises a metal material layer 22 made of metal, for example, copper or aluminum, metal fiber resin material layers 23 joined to both sides of the metal material layer 22, and conductive patterns 13 and resist films 14 on these metal fiber resin material layers 23.

Since the metal material layer 22 is located in the center of the substrate 21, heat radiation and mechanical strength of this embodiment are higher than those of the first embodiment. In particular, the mechanical strength is effectively increased by making the thickness of the metal material layer 22 more than 1 mm. Furthermore, it is possible to make material cost lower than when a metal substrate is used.

Embodiment 5

Figure 8:
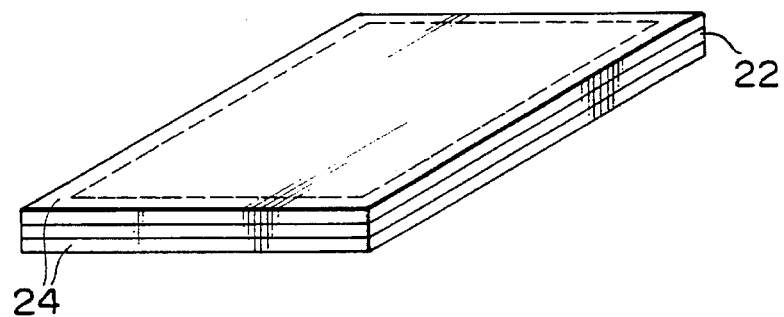
FIG. 8 is a perspective view of an IC card according to a fifth embodiment of the present invention.
Figure 9:
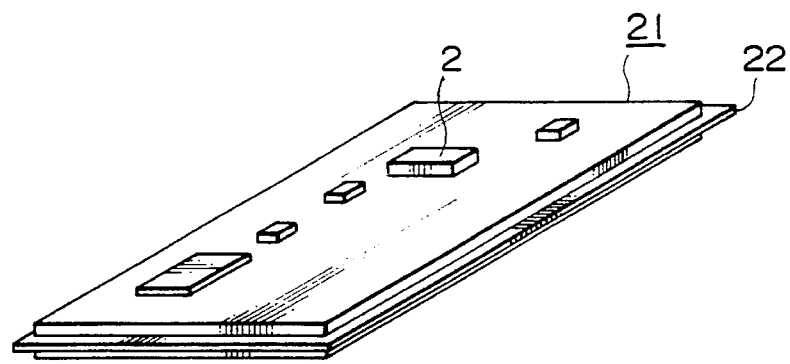
FIG. 9 is a perspective view of a substrate shown in FIG. 8.

FIG. 8 is a perspective view of an IC card according to a fifth embodiment of the present invention, and FIG. 9 is a perspective view of a substrate shown in FIG. 8. In this fifth embodiment, a substrate 21 has a metal material layer 22 similar to that in the fourth embodiment. The metal material layer 22 projects outside from all the periphery of the substrate 21. Electronic components, such as IC packages 2, are mounted on the substrate 21, and the substrate 21 is, as shown in FIG. 8, molded together with sheathing members 24 made of thermosetting resin, such as an epoxy resin or a thermoplastic resin, and shaped into a card. At this time, edges of the metal material layer 22 are exposed from the entire periphery of the IC card.

Since the edges of the metal material layer 22 are thus exposed, heat transmitted to the metal material layer 22 is directly radiated into outside air from the exposed edges and, therefore, heat radiation is further improved. In addition, since the whole substrate 21 is molded together with the sheathing members 24, a frame and a panel can be omitted. Therefore, the number of components is reduced and assembly is simplified.

Embodiment 6

Figure 10:
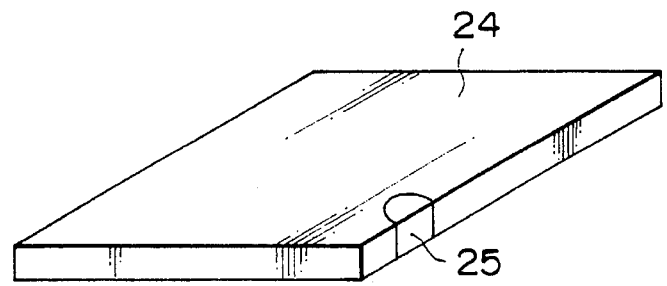
FIG. 10 is a perspective view of an IC card according to a sixth embodiment of the present invention.
Figure 11:
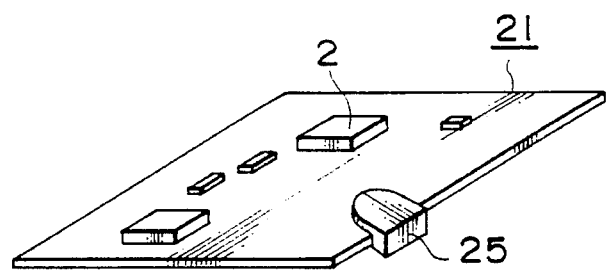
FIG. 11 is a perspective view of a substrate shown in FIG. 10.
Figure 12:
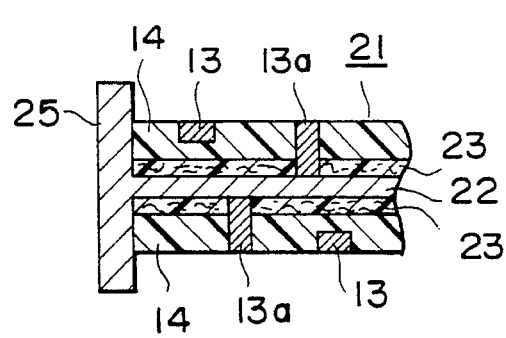
FIG. 12 is a sectional view of the principal part the substrate shown in FIG. 11.
Figure 13:
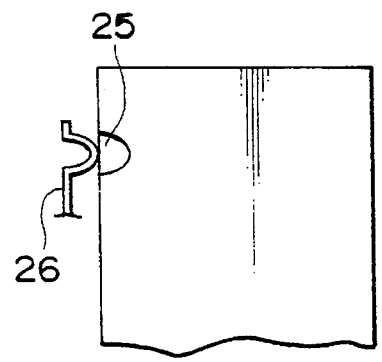
FIG. 13 is a plan view showing of a terminal portion shown in FIG. 10 and an external terminal.

FIG. 10 is a perspective view of an IC card according to a sixth embodiment of the present invention, FIG. 11 is a perspective view of a substrate shown in FIG. 10, and FIG. 12 is a sectional view showing the principal part of the substrate shown in FIG. 11. In the sixth embodiment, a substrate 21 has a metal material layer 22 similar to that shown in the fourth embodiment. A terminal portion 25 for external connection is integrally formed with a part of the metal material layer 22 as shown in FIG. 11. Conductive patterns 13 are electrically connected to the metal material layer 22 through connecting portions 13a locally disposed.

Electronic components, such as IC packages 2, are mounted on the substrate 21, and the whole substrate 21 is sheathed with a sheathing member 24 made of, for example, epoxy resin, as shown in FIG. 10, and shaped like a card. At this time, the terminal portion 25 is exposed.

Since the terminal portion 25 is exposed from a part of the outer periphery of the IC card, the IC card can be easily connected to an external device, such as a reader/writer, and supplied with power by bringing the terminal portion 25 in contact with a connecting terminal 26 of the external device. When the IC card is carried about, the terminal portion 25 functions as a ground for preventing damage by static electricity. The connecting portions 13a are formed by making holes in predetermined positions of metal fiber resin material layers 23 and resist films 14 on the metal fiber resin material layers 23, and filling the holes with an electrically conductive material when the conductive patterns 13 are formed.

However, since the whole metal material layer 22 is electrically connected to the conductive patterns 13 in the IC card of the sixth embodiment, the thickness of the grounds of the resist films 14 is required to be more than 200 μm to 300 μm in order to maintain insulation properties. If the resist films 14 are too thick, heat radiation is lowered. Therefore, the resist films 14 are required to be so thick as to achieve good insulation properties and high heat radiation.

Figure 14:
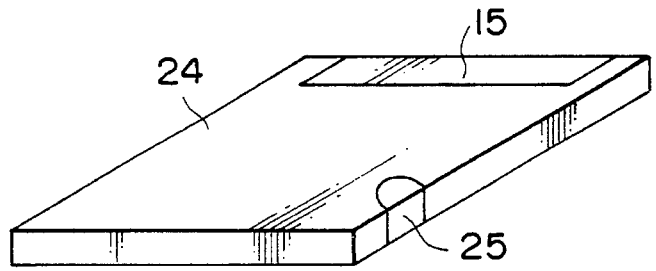
FIG. 14 is a perspective view showing the IC card shown in FIG. 10 provided with a connector.

Although only the terminal portion 25 is exposed outside in the IC card of the sixth embodiment, it is possible to connect a connector 15 to the substrate of FIG. 11 and exposed as shown in FIG. 14. Such an IC card can be used as, for example, a memory card or a microprocessor-controlled card.

Embodiment 7

Figure 15:
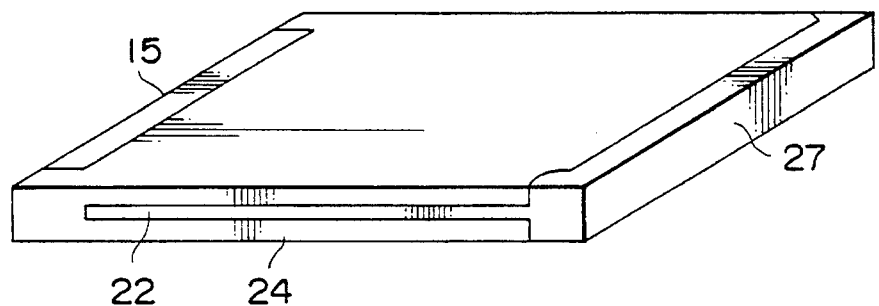
FIG. 15 is a perspective view of an IC card according to a seventh embodiment of the present invention.
Figure 16:
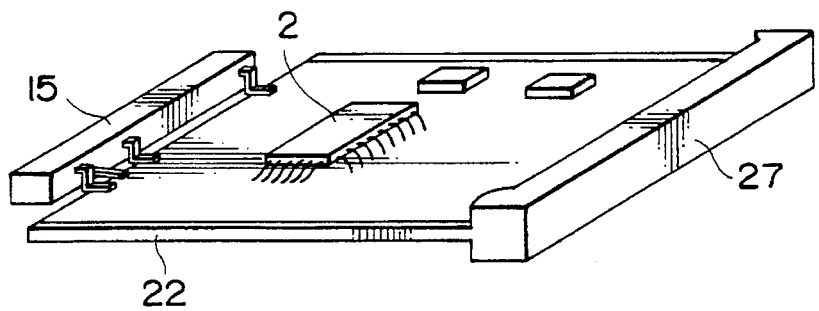
FIG. 16 is a perspective view of a substrate shown in FIG. 15.

FIG. 15 is a perspective view of an IC card according to a seventh embodiment of the present invention, and FIG. 16 is a perspective view of a substrate shown in FIG. 15. In the IC card of the seventh embodiment, a connector 15 is connected to one side of the substrate. On the other three sides, a metal material layer 22 of the substrate is exposed outside. A thick-walled portion 27, in which a metal material layer 22 has the same thickness as the IC card (for example, 5 mm), is located on the side opposite the side with the connector 15.

Since the thick-walled portion 27 is part of the metal material layer 22, the center of gravity of the whole IC card is shifted toward the thick-walled portion 27. Therefore, when the IC card falls, the thick-walled portion 27 first collides with the ground, thereby preventing the connector 15 from being damaged.

Although the thick-walled portion 27 is located on the opposite side of the substrate from the connector 15, in the above embodiment, it may be located on another side if the center of gravity of the whole IC card can be shifted to prevent the IC card from falling with the connector 15 down.

Embodiment 8

Figure 17:
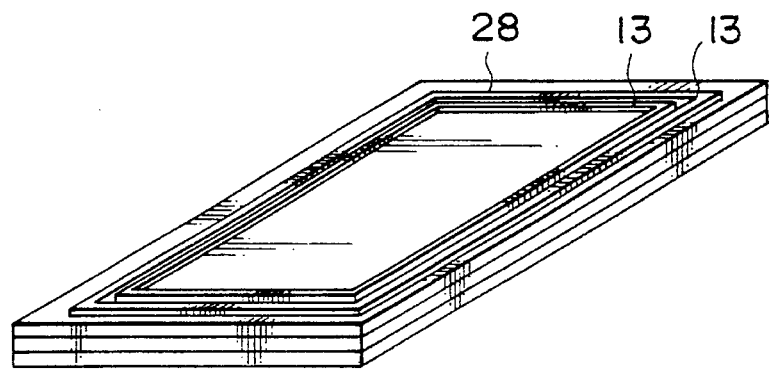
FIG. 17 is a perspective view showing a substrate of an IC card according to an eighth embodiment of the present invention.
Figure 18:
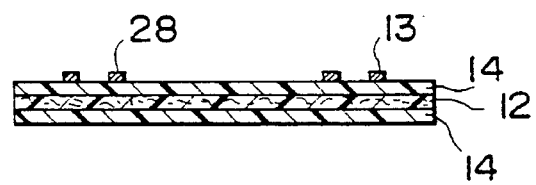
FIG. 18 is a sectional view of the substrate shown in FIG. 17.

FIG. 17 is a perspective view showing a substrate of an IC card according to an eighth embodiment of the present invention, and FIG. 18 is a sectional view of the substrate shown in FIG. 17. In the substrate of the eighth embodiment, a coil 28 of a conductive pattern 13 is formed on a metal fiber resin material layer 12 by means of resist films 14 in the same manner as in the above-mentioned first embodiment. The coil 28 is formed through deposition, masking, exposure, and developing processes.

This IC card can be used as an electromagnetically induced (non-contact) and microprocessor-controlled card.

Although the IC cards of the above embodiments each use a metal fiber resin material only for the substrate or for both the substrate and the frame, the metal fiber resin material may be used only for the frame. In this case, heat radiation and mechanical strength can be improved, and material cost can be lower than that of an IC card having a frame made of a metal.

What is claimed is:

1. An IC card, comprising:
    a substrate having a metal fiber resin material layer including a mixture of a resin and metal fibers and a conductive pattern electrically insulated from said metal fiber resin material layer;
    an IC mounted on said substrate; and
    a sheathing member sheathing said substrate.

2. The IC card according to claim 1 wherein a resist film is interposed between said metal fiber resin material layer and said conductive pattern.

3. The IC card according to claim 1 wherein said sheathing member includes a frame made of said metal fiber resin material for holding said substrate, and panels attached to said frame opposed to said substrate.

4. The IC card according to claim 3 wherein said metal fiber resin material layer and said frame are unitary.

5. The IC card according to claim 1 wherein said substrate has a metal layer on which said metal fiber resin material layer is disposed.

6. The IC card according to claim 1 wherein said sheathing member is a resin material molded into a shape of a card, said substrate includes a metal layer on which said metal fiber resin material layer is deposited, wherein at least a part of said metal layer is exposed outside of said IC card.

7. The IC card according to claim 6 wherein said metal layer and said conductive pattern are electrically connected to each other and a terminal portion for contacting a connecting terminal of an external device is located in a part of said metal layer exposed outside of said IC card.

8. The IC card according to claim 6 including a connector connected to one end of said substrate and a thick-walled portion of said metal layer located on at least one other end of said substrate, and wherein said substrate has a center of gravity shifted toward said thick-walled portion.

9. An IC card comprising:
    a substrate having a conductive pattern;
    an IC mounted on said substrate;
    a frame made of a metal fiber resin material including a mixture of a resin and metal fibers holding said substrate; and
    panels attached to said frame opposed to said substrate.

* * * * *